(12) United States Patent
Komobuchi et al.

(10) Patent No.: US 6,812,960 B1
(45) Date of Patent: Nov. 2, 2004

(54) PHOTOELECTRIC TRANSDUCER AND SOLID-STATE IMAGE PICKUP DEVICE

(75) Inventors: Hiroyoshi Komobuchi, Kyoto (JP); Takahiro Yamada, Hirakata (JP); Junichi Onoue, Yamatokouriyama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/341,222

(22) PCT Filed: Nov. 4, 1998

(86) PCT No.: PCT/JP98/04971

§ 371 (c)(1),
(2), (4) Date: Jul. 7, 1999

(87) PCT Pub. No.: WO99/25117

PCT Pub. Date: May 20, 1999

(30) Foreign Application Priority Data

Nov. 7, 1997 (JP) .............................. 9-305453

(51) Int. Cl.⁷ .......................... H04N 5/235; H04N 5/335
(52) U.S. Cl. ................................ 348/229.1; 348/222.1; 348/230.1; 348/294; 348/297; 348/300; 348/362
(58) Field of Search ................................ 348/229.1, 362, 348/230.1, 364, 367, 297, 222.1, 294, 300

(56) References Cited

U.S. PATENT DOCUMENTS 3,777,056 A * 12/1973 Pieters ........................ 348/255
4,682,211 A * 7/1987 Kaji ........................... 348/229.1
5,162,913 A * 11/1992 Chatenever et al. ....... 348/230.1
5,422,669 A * 6/1995 Mori ......................... 348/230.1

FOREIGN PATENT DOCUMENTS

| JP | 7-327172 | 12/1995 | .......... H04N/5/335 |
| JP | 7-335936 | 12/1995 | .......... H01L/31/107 |
| JP | 10-41538 | 2/1998 | .......... H01L/31/107 |

OTHER PUBLICATIONS

International Search Report for Int'l Appln. No. PCT/JP98/04971 dated Feb. 16, 1999.

* cited by examiner

Primary Examiner—Andrew Christensen
Assistant Examiner—Brian Genco
(74) Attorney, Agent, or Firm—RatnerPrestia

(57) ABSTRACT

A photoelectric transducer provided with a first photoelectric converting section for generating an electric charge according to incident light, an accumulating section for accumulating the electric charge generated by the first photoelectric converting section, an amplifying section for amplifying the electric charge outputted from the accumulating section with a prescribed gain, and a storage section for memorizing signal charges amplified by the amplifying section, characterized in that the prescribed gain in the amplifying section is altered in 1 field/1 frame period on the basis of the number of electric charges accumulated in the accumulating section during a prescribed period before the application of the gain.

11 Claims, 22 Drawing Sheets

3 1 : Photoelectric transducer
3 2 : Electric charge accumulating section
3 3, 3 4, 3 5 : Band offset type avalanche multiplication layer film
3 6, 3 7, 3 8, 3 9 : Conducting film 11 : Solid-state image pickup device 31 : Photoelectric transducer 32 : Electric charge accumulating section 33, 34, 35 : Band offset type avalanche multiplication layer film 36, 37, 38, 39 : Conducting film 40 : Si-avalanche multiplication layer film
41 : Photoelectric transducer
42 : Electric charge accumulating section Fluctuation of light Control of fluctuation

PHOTOELECTRIC TRANSDUCER AND SOLID-STATE IMAGE PICKUP DEVICE

This application is the U.S. national-phase application of PCT International application No. PCT/JP98/04971.

TECHNICAL FIELD

The present invention relates to a solid-state image pickup element utilizing a photoelectric transducer.

BACKGROUND ART

Solid-state image pickup devices, typically CCD type solid-state image pickup devices, tend to be miniaturized and have high resolution in order to be mounted on portable electronics such as video cameras and electronic still cameras. In addition, to prevent sensitivity from being degraded by the miniaturization, it is necessary to bring the effective aperture area close to 100%; to meet this need, an on-chip microlens which collects incident light beams on the upper side of a photoelectric conversion element is adopted with a view to increasing the apparent light receiving area in the photoelectric conversion element.

On the other hand, in spite of such a contrivance, the S/N ratio, one of the most important determinants of the picture quality, is uniquely decided by the shot noise that the incident light itself has as a physical limitation. The S/N value in this case is proportional to the square root of p, which is the total number of incident photons that can be detected by a single pixel. Further, since p is proportional to the product of the time of accumulation and the number of incident photons per unit time, if p is sufficiently increased by exposure to light for a long time, the S/N ratio is naturally enhanced. That is, if the light receiving area is the same, the image pickup of an object with a small number of incident photons, in other words a dark object, is realized only by long hour exposure to light theoretically.

However, as it is also true of the NTSC system, which is one of the TV standard systems currently in use, the accumulation time per frame/field is fixed. Moreover, to secure a required level of dynamic resolution as well, varying the exposure time beyond a certain limit to match the relative brightness of the object is not realistic.

DISCLOSURE OF THE INVENTION

The object of the present invention is to provide a solid-state image pickup device and a photoelectric transducer for use therein capable of realizing an enhancement of the S/N ratio against shot noise by photons, taking account of the limit to the S/N ratio caused by the fact that light itself has fluctuations in the number of photons due to the Poisson distribution.

To achieve the object, one aspect of the present invention is a photoelectric transducer characterized by comprising a photoelectric converting means 1 for generating an electric charge according to incident light, an amplifying means 2 for amplifying a signal charge generated by photoelectric conversion, a memory for accumulating the signal charge amplified with a prescribed gain, and a consecutive gain control means 4 for controlling the gain of said amplifying means 2 according to the number of accumulated electric charges.

Another aspect of the present invention (corresponding to claim 2) is a photoelectric transducer comprising a first photoelectric converting section 12 for generating an electric charge according to incident light, an accumulating section for accumulating electric charges generated by said first photoelectric converting section 12, an amplifying section 14 for amplifying the electric charge (existing in 13) outputted from said accumulating section with a prescribed gain, and a storage section 16 for memorizing signal charges amplified by the amplifying section 14, characterized in that said prescribed gain in the amplifying section is changed in 1 field/1 frame period, on the basis of the number of electric charges accumulated in said storage section 16 during a prescribed period before the time of application of that gain.

Still another aspect of the present invention is a photoelectric transducer comprising a first photoelectric converting section, disposed in a light receiving section, for generating an electric charge according to incident light, an accumulating section for accumulating signal electric charges from said first photoelectric converting section, and a negative feedback amplifying section, characterized in that said negative feedback amplifying section is of a conducting type reverse to said first photoelectric converting section, disposed adjoining said first photoelectric converting section in the light receiving section, and includes a second photoelectric converting section for generating an electric charge according to incident light, and a charge source of the same conducting type as said photoelectric converting section for supplying electric charges to said accumulating section, and signal charges flowing from said charge source is caused to be modulated, in 1 field/1 frame period, by the signal charges generated or accumulated by said second photoelectric converting section.

Yet another aspect of the present invention is a photoelectric transducer comprising a photoelectric converting section for generating an electric charge according to incident light and an accumulating section for accumulating the electric charges generated by said photoelectric converting section, characterized in that the part where photoelectric conversion is performed is an avalanche photodiode, the avalanche photodiode consists of a plurality of band offset type avalanche multiplication layer films stacked over said accumulating section via a plurality of conducting films connected to each other by fixed resistances, and these avalanche multiplication layer films vary in composition with reference the direction of stacking, the multiplication rate of each avalanche multiplication layer film stacked varies, in 1 field /1 frame period, according to the number of electric charges accumulated in said accumulating section.

Still yet another aspect of the present invention is a photoelectric transducer comprising a photoelectric converting section for generating an electric charge according to incident light, an accumulating section for accumulating electric charges generated by said photoelectric converting section, and an A/D converter for digitizing the signal charges accumulated in said accumulating section at each breakdown or non-breakdown readout, characterized in that regarding each of signal charges consecutively outputted from the A/D converter, the signal charges having the largest value and the smallest value, or a plurality of prescribed signal charges are abandoned within a predetermined number of consecutive signal charges.

Generally, even if a signal charge that has been obtained by photoelectric conversion at a certain quantum efficiency is subjected to a certain output amplification by a multiplying means having a certain gain, an S/N ratio determined by the light shot noise never changes. On the other hand, according to the present invention, that multiplication gain in accordance with the hysteresis of the number of accumulated electric charges (the number of electric charges that have been accumulated so far). Thus it is so arranged that the gain decrease if the number of electric charges that have been accumulated is large and, conversely, the gain be kept high if the number of accumulated electric charges is small. FIG. 23 is a schematic view showing that shot noise of light. It is seen that the number of photons is fluctuating. Accordingly, during each timing period, $M_t$ to $M_{t+1}$, $M_{t+1}$ to $M_{t+2}$, ..., the enhancement of the S/N ratio is intended by changing the gain in the intermediate and late phases during each period correspondingly to the number of photons in the early phase. FIG. 24 depicts the distribution of fluctuations, and the meaning of the present invention is to enhance the S/N ratio by cutting off the hatched parts.

As a result, in the average number of incident photons P (photons/s) for example, the shot-related S/N ratio that the number of photons coming incident in the accumulation period $T_F$ (s) during 1 field period has in itself is $(P\,T_F)^{1/2}$, but according to the present invention, it is possible to obtain an S/N ratio surpassing this value. FIG. 8 illustrates a simulative view in comparison with the S/N ratio (solid line) in one embodiment of the present invention and the S/N ratio (dotted line) in an ordinary according to the prior art. This point will be described in detail later.

Since the foregoing logic holds for image pickup devices for all kinds of electromagnetic waves including not only visible light but also infrared, ultraviolet and X rays, the present invention is applicable to these image pickup devices comprehensively.

Figure 1:
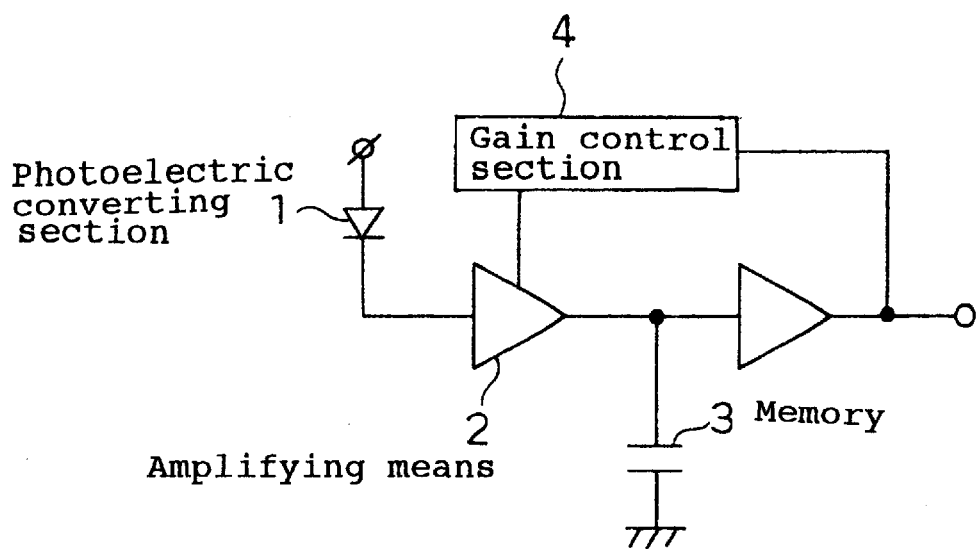
FIG. 1 is a diagram illustrating the basic circuit configuration of a solid-state image pickup device, which is one mode of carrying out the present invention.

DESCRIPTION OF SYMBOLS 1, 23 Photoelectric conversion part
2 Multiplying (amplifying) means
3 Memory
4 Gain control section
11, 21 Solid-state image pickup device
12 CCD
13 Line memory
14 Arithmetic section
15 DSP
22 Vertical transfer area
24 Separating section
26 Electric charge (electron) source
27 Insulating layer
31, 41 Photoelectric transducer
32, 42 Electric charge accumulating section
33, 34, 35 Band offset type avalanche multiplication layer film
36, 37, 38, 39 Conductive film
40 Si-avalanche multiplication layer film
φV1 to φV5, φVS Electrodes

BEST MODES FOR CARRYING OUT THE INVENTION

Embodiments of the present invention will be described below with reference to the accompanying drawings.

FIG. 1 is a schematic view of one embodiment of the present invention. This embodiment is a photoelectric transducer characterized by comprising a photoelectric conversion means 1 for generating electric charges according to incident light, an amplifying means 2 for amplifying a signal charge generated by photoelectric conversion, a memory for storing the signal charge amplified by a prescribed gain, and a consecutive gain controlling means 4 for controlling a gain in the amplifying means 2 in accordance with its number of accumulated electric charges. Its operation is such that when light comes incident on the means 1 having a photoelectric converting function and is photoelectrically converted, a signal charge is generated according to the quantity of the incident light. The signal charge is amplified by the amplifying means 2 having an amplifying function by a prescribed gain, and is accumulated in the memory 3. The number of these accumulated electric charges is fed back to the consecutive gain controlling means 4, and the gain controlling means 4 controls the gains of subsequent signal charges on that basis.

Incidentally, although analog notations are given in FIG. 1 because of the equivalent circuit readout used, realization is also possible in digital notations using an ADC and a DAC.

The aforementioned number of accumulated electric charges that is fed back should preferably be a function of the value that results from the integration of the product of a multiplication gain M and the number n of accumulated electric charges per unit length of time with the time length of accumulation. Accordingly, a multiplication gain in this case is determined by the following Equation 1.

$$M_{t+1} = f\left(\int_0^t M_t \cdot n\, dt\right) \text{ where } \frac{df(\ )}{d(pt)} \leq 0 \qquad \text{[Equation 1]}$$

Needless to mention, the circuit configuration described above is applicable for a photoelectric transducer used either independently or in a line sensor.

As the amplifying means, a variety of forms are applicable such as means of digital signal processing represented by a digital signal processor (DSP), a negative feedback circuit and an avalanche photodiode.

Where a DSP is disposed at a downstream stage of a line sensor or an area sensor, an arithmetic expression to approximate the above-cited integral expression for calculating the hysteresis of the number of accumulated electric charges by consecutive approximation is performed by the DSP. This is preferable in that it permits accurate digital control of gains. However, to reduce follow-up errors caused by internal delays in the digital feedback system, intrinsic to consecutive calculation, it is necessary to use a solid-state image pickup element whose readout rate is as fast as possible.

In the pixel section, or the photoelectric converting section, when a negative feedback circuit together with a photodiode is used, a second photoelectric converting section whose conducting type is reverse to the photoelectric converting section and which is disposed in the photoelectric converting section, and a charge source whose conducting type is the same as that of the photoelectric converting section, are provided, and the signal charge flowing from the charge source is caused to be modulated by the signal charge that has been generated or accumulated in the second photoelectric converting section. Unlike in the aforementioned DSP, where the gain to the signal charge of each pixel has to adopt a fixed value from one readout to next, the negative feedback circuit incorporated into the pixel section makes it possible to reduce the aforesaid follow-up errors intrinsic to consecutive calculation because the gain varies according to the accumulated quantity of electric charges from time to time.

When the avalanche photodiode (APD) is adopted in the pixel section, using it in an electric charge accumulating mode in the photoelectric converting section serves to reduce potential differences between p-n junctions as well as to amplify signal charges by avalanche multiplication, and the amplified gains of succeeding signal charges are autonomously suppressed. However, in the case of a conventional Si-APD, multiplication gains fluctuate due to the arbitrariness of the generating position of the avalanche multiplication phenomenon in the depletion layer. This is commonly known as excess noise, which calls forth new noise. The higher the multiplication gain is set, the more conspicuous this excess noise. In contrast, the use of an inclined superlattice type, which makes possible pinpointing of the generating position of the avalanche multiplication, provides the benefit of enabling the excess noise to be suppressed. Further, as proposed in the form of the present embodiment, since it is possible to compute multiplication gains digitally, the gain control can be performed accurately. At the same time, a greater gain entails an abrupt increase in the intensity of suppression, by as much as an exponentiation of 2. For example, in the initial stage, the gain suddenly drops from the tenth power of 2 (1024) to the ninth power (512). To prevent this, when a large initial gain (eightfold or more, for example) is to be realized, at least one of the band offset sections in the stacked hetero junction part should be suppressed to an appropriate value of 3/2·Eg (Eg: gap energy) or below, and the gain should be prevented from increasing by this power number each time one band offset is passed.

Next, specific examples briefly referred to in connection with the above described mode of carrying out the invention will be separately explained.

Embodiment 1

Figure 2:
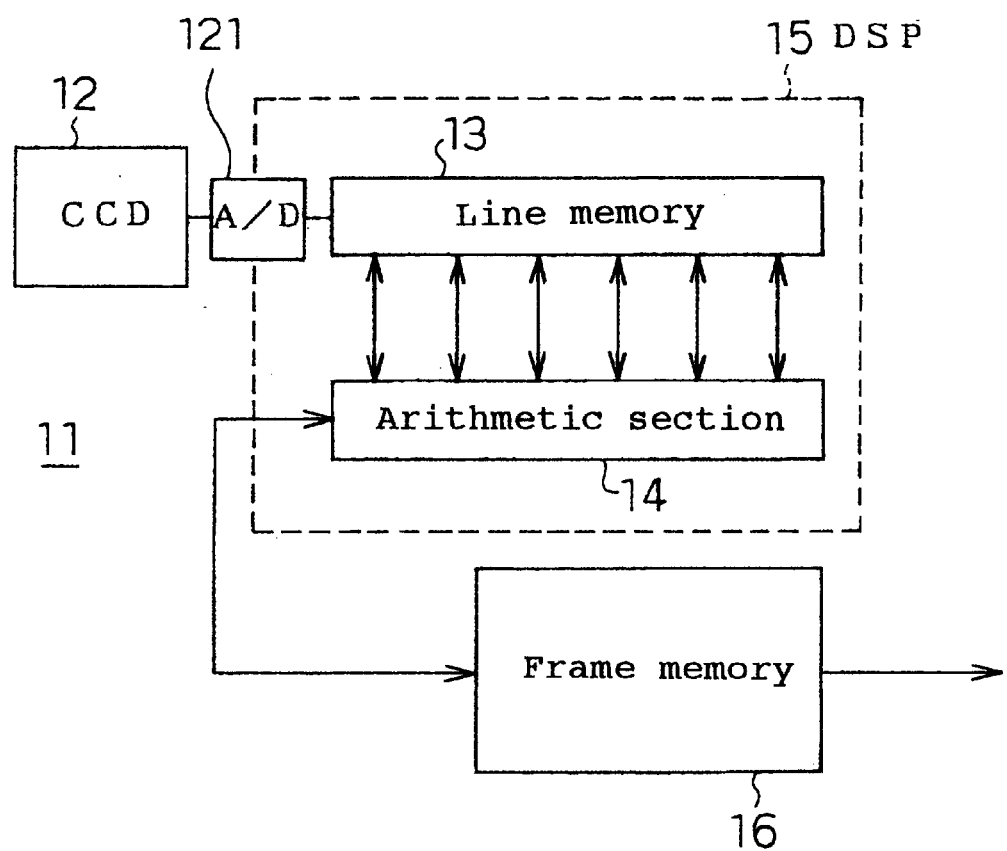
FIG. 2 is a block diagram showing the configuration of the image pickup device of Embodiment 1 according to the present invention.

This is an embodiment using a DSP as a multiplying means. FIG. 2 is a block diagram showing a configuration for the application and development of this embodiment for a line sensor or an area sensor. A solid-state image pickup device 11 is provided with a high-speed readout CCD 12 in the line sensor or the area sensor, an A/D converter 121, a DSP 15 having a line memory 13 and an arithmetic section 14, and a frame memory 16.

The arithmetic section 14, storing Equation 2 for gain control as presented below, outputs signals. Here, $M_t$ represents the multiplication gain at a point of time t; n, the number of accumulated electric charges per unit length of time; and $M_{t+1}$, the multiplication gain at a point of time t+1.

$$M_{t+1} = f\{\Sigma(M_t \cdot n)\} \qquad \text{[Equation 2]}$$

With this device 11, the signal charge of the mth line read out from the CCD 12 is stored into the line memory 13, and signal charges before the mth line are memorized into the frame memory 16. From the frame memory 16, the line of the pixel position corresponding to the line to be read out of the CCD 12 to the DSP 15 is inputted into the arithmetic section 14, where computation according to Equation 2 presented above is carried out up to the (n−1)th line, and the signal charge of the nth line stored in the line memory 13 is amplified by the calculated gain and outputted.

Thus, at a certain timing, the signal charge is stored into the line memory 13 line by line; the arithmetic section 14 reads the state of signal charge accumulated up to the current time from the frame memory 16; the gain is determined according to a gain decision table or a decision function, and the signal charge in the line memory 13 is multiplied by that gain and stored into the frame memory 16.

At the next timing, the same steps are repeated. The period of each such timing is 1/1000 second, for example.

This is continued for 1 field/frame period (1/30 second or 1/60 second) and, after completion of that 1 field/frame period, the signal charges are outputted from the frame memory 16.

In other words, during a 1 field/frame period, the gain is to be changed on the basis of the number of electric charges accumulated in the storage section 16 a prescribed period before the application of the gain.

Embodiment 2

Figure 3:
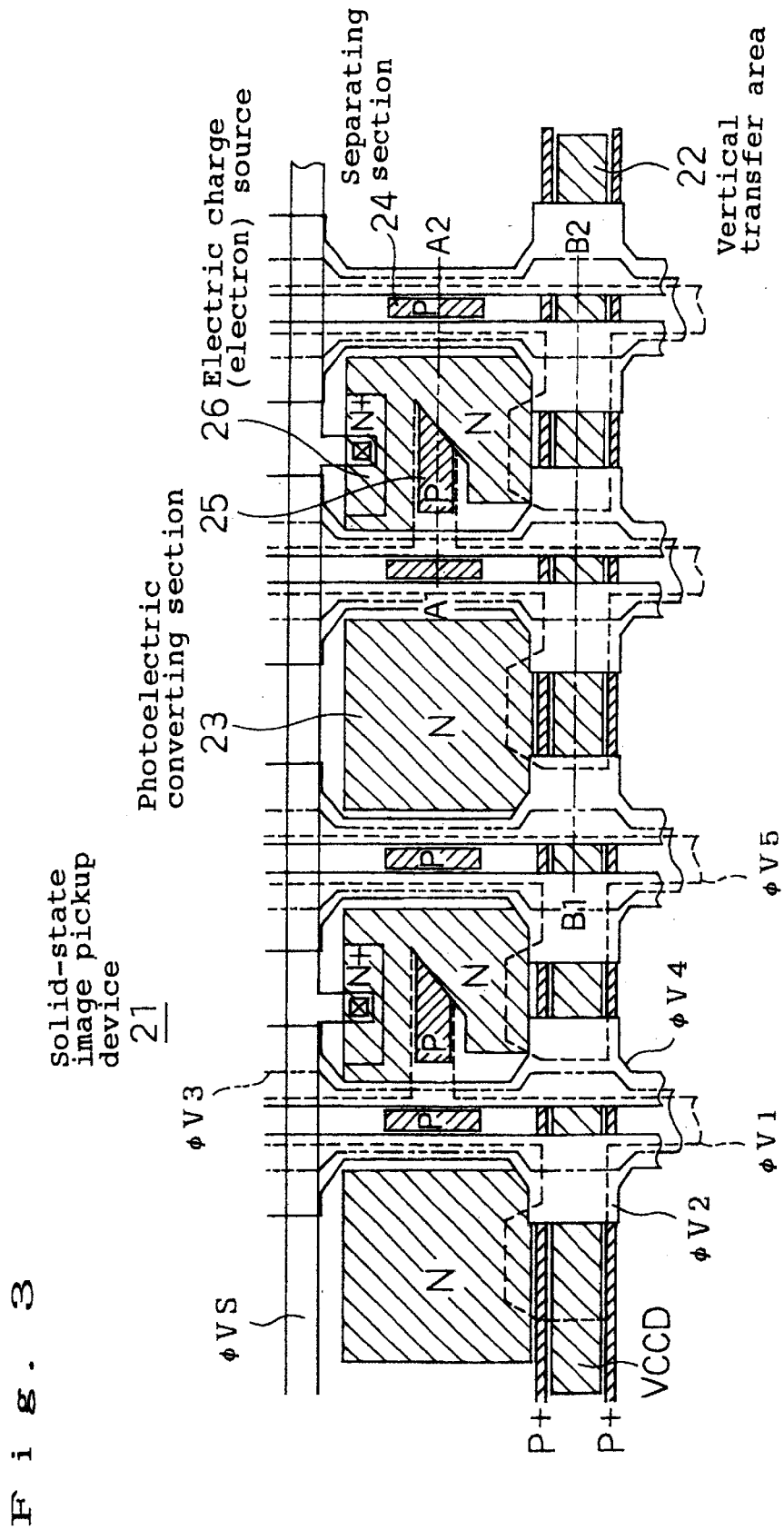
FIG. 3 is a plan illustrating the image pickup device of Embodiment 2 according to the present invention.
Figure 4:
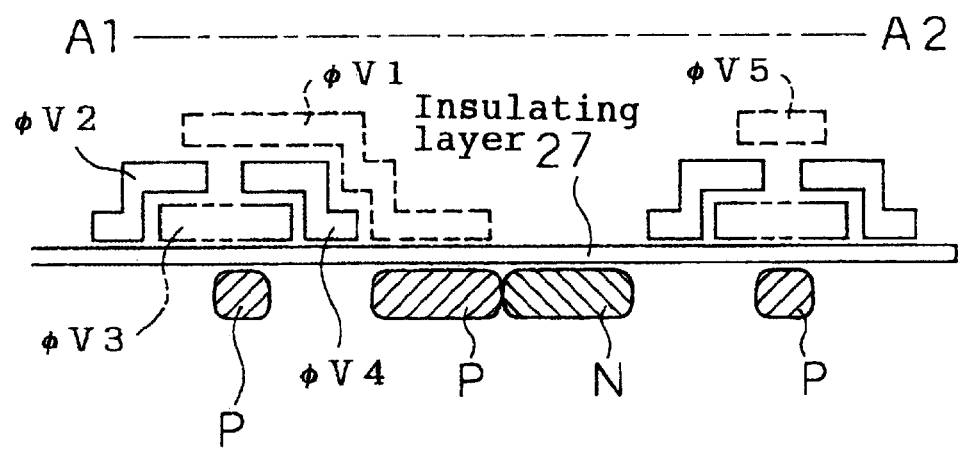
FIG. 4 is an A1–A2 sectional view of FIG. 3.
Figure 5:
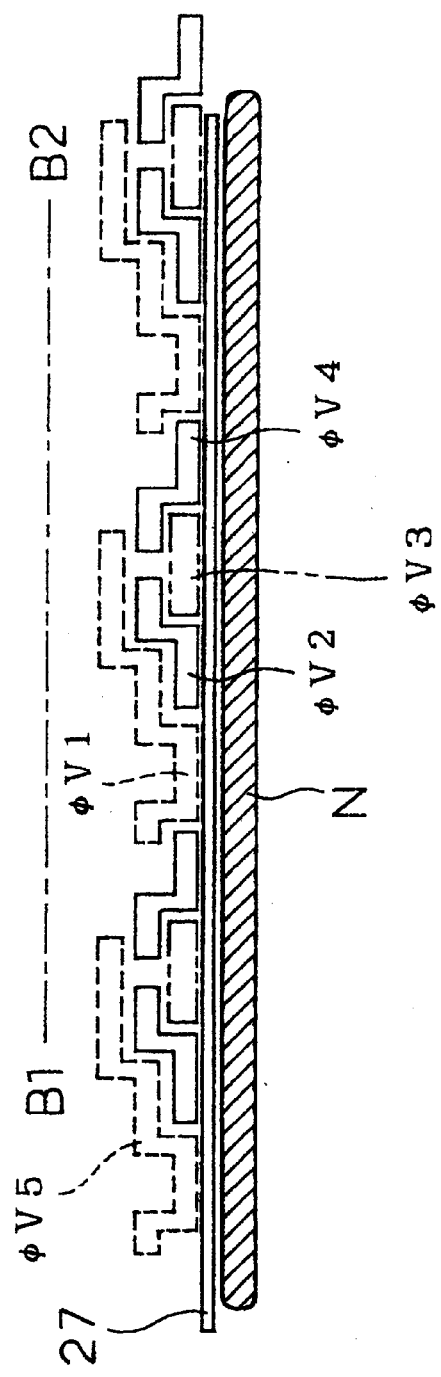
FIG. 5 is a B1–B2 sectional view of FIG. 3.

This is an embodiment of a CCD solid-state image pickup device according to the present invention using a negative feedback type amplifier as the multiplying means. FIGS. 3 to 5 show the hardware structure of this embodiment. FIG. 3 is its plan; FIG. 4, an A1–A2 sectional view of FIG. 3, and FIG. 5, a B1–B2 sectional view of FIG. 3.

A CCD solid-state image pickup device 21 is provided with a belt-shaped vertical transfer area 22 composed of N-type semiconductors, photoelectric converting sections 23 composed of N-type semiconductors arrayed in the same direction, separating sections 24 composed of P-type semiconductors for separating photoelectric converting sections 23 from each other, and transfer electrodes φV1 to φV5. Although, in the present embodiment, the photoelectric converting sections 23 constitute an arrangement in which conventional ones with no negative feedback amplifier and ones of the structure of this embodiment each with a negative feedback type amplifier alternate each other, the arrangement may as well solely consist of ones with negative feedback amplifiers. Hereafter, only the parts having the structure of this embodiment will be described.

Each of the photoelectric converting sections 23 is provided with a second photoelectric converting section 25 consisting of a P-type semiconductor whose tip pierces into inside from a part near the separating section 24, and an electron source 26 composed of an N+-type semiconductor and opposite the second photoelectric converting section 25 along the side farther from the vertical transfer area 22. These second photoelectric converting section 25 and electron source 26 are paired to generate a narrow channel effect, and perform the electron flow control over the signal charges from the electron source 26 to the photoelectric converting section 23, thereby functioning as a negative feedback type amplifier.

On the surface of the vertical transfer area 22 and the photoelectric converting section 23, various electrodes are provided via an insulating layer 27 consisting of an oxide film. In a position opposite the vertical transfer area 22, with a photoelectric converting section 23 in-between, an electrode φVS composed of aluminum for instance is arranged in parallel to the vertical transfer area 22, and is connected to the electron source 26 by a contact hole as indicated by an X mark. On the surfaces between adjoining photoelectric converting sections 23, φV3; φV2 and φV4 opposing and partly overlapping φV3; and φV1 over φV4, all of polysilicon, are disposed via oxide films not shown, and extend to over the vertical transfer area 22. In the drawing, the shape of φV1 is indicated by thick broken lines; those of φV2 and φV4, by thin solid lines, and that of φV3, by a two-dot chain lines. φV1 also extends to over the second photoelectric converting section 25. While the vertical transfer area 22 and the photoelectric converting section 23 are separated from by P+ layers arranged in a belt shape on both sides of the vertical transfer area 22, but φV1 extends over the vertical transfer area 22 where it is covered by no other electrodes, and further overlaps the edge of the photoelectric converting section 23 across the P+ layer. The overlapping part between φV1 and the vertical transfer area 22 functions as a transfer electrode, and the overlapping part between φV1 and the photoelectric converting section 23 functions as a read gate. φV5 has the same shape as φV1 except that it does not extend over the second photoelectric converting section 25.

Figure 6:
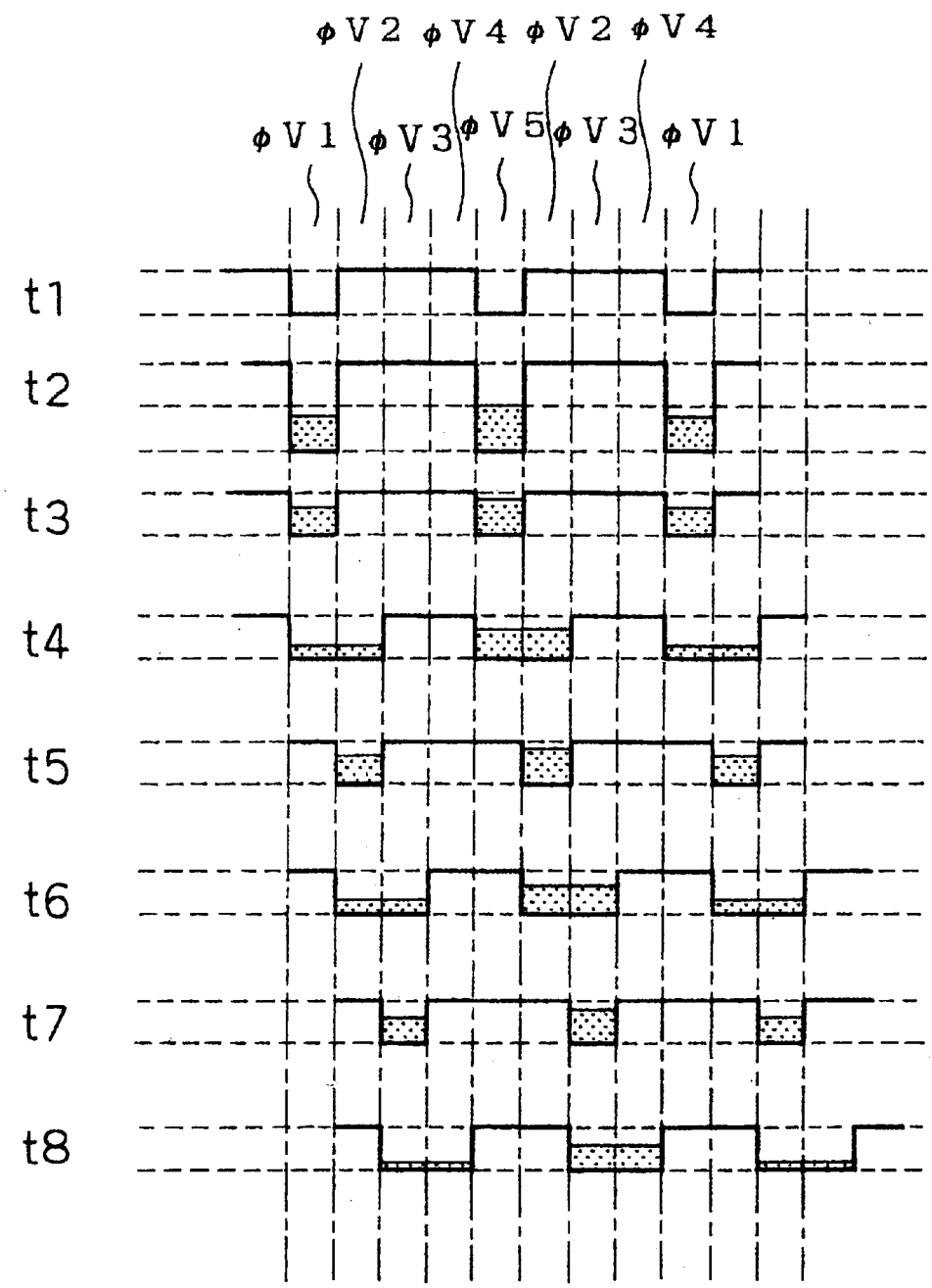
FIG. 6 is a diagram showing electrode potentials for different time segments in the image pickup device of Embodiment 2 according to the present invention.
Figure 7:
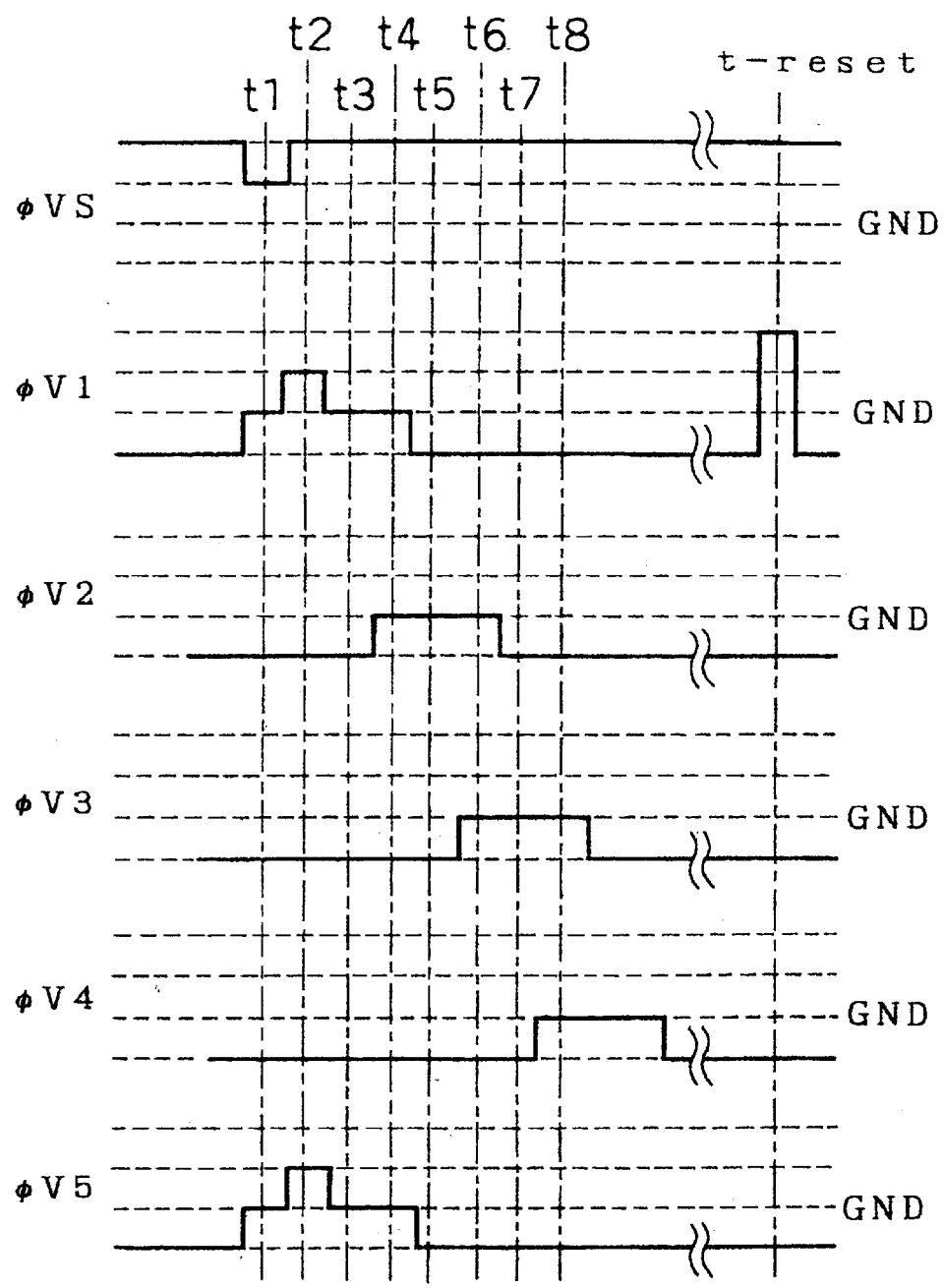
FIG. 7 is a time chart of applied voltages on different electrodes in the image pickup device of Embodiment 2 according to the present invention.

The operation of this embodiment will be described next with reference to FIGS. 6 and 7. FIG. 6 is a diagram showing the electrode potential at each point of time, and FIG. 7 is a time chart of voltages applied to different electrodes.

The state in an accumulation period t1 is such that φV1 and φV5 are 0 V, and a negative voltage (−8 V, for example) is applied to other electrodes except φVS; signal charges (electrons in this case) are accumulated in the photoelectric converting section 23 according to the quantity of received light. Positive holes in the same number of electric charges generated at this time are accumulated in the second photoelectric converting section 25. Although φVS is normally supplied with a larger voltage (8 V, for example) than the depletion voltage in the photoelectric converting section 23, the voltage is reduced to the aforementioned depletion voltage in the photoelectric converting section (4 V, for example) at t1, and electrons are flowed from the electron source 26 to the photoelectric converting section 23 as second signal charges. However, their quantity is modulated because a narrow channel effect occurs according to the number of positive holes accumulated in the second photoelectric converting section 25.

When 15 V is applied to φV1 and φV5 at read time t2, the potential of the read gate that is a part of φV1 and φV5 drops, and the second signal charge is added to the signal charge according to the quantity of received light to be read out to the vertical transfer area 22. After the readout is completed and time t3 comes, the voltages of φV1 and φV5 are reduced to 0 V, and the read gate is closed. At time t4, the voltage of φV2 is also reduced to 0 V to remove the barrier, and half of the signal charges are transferred to φV2. At time t5, the voltage of φV1 is set to −8V to erect a barrier, the other half of the signal charges are also transferred to φV2. Subsequently, half of the signal charges are transferred to φV3 at time t6 in the same manner, and the rest is also transferred in timing t7, followed by a transfer of half of the signal charges again to φV4 at time t8. After that, with this peristaltic motion (charge transfer) repeated, the signal charges are vertically transferred to a horizontal transfer region not shown.

Further, resetting of the positive holes accumulated in the second photoelectric converting section 25 is performed as a large positive voltage, about 20 V for example, is applied to φV1 at an appropriate timing during 1 field, and the charges are flowed to the GND through the P+ layers around kept at the GND voltage by Coulomb repulsion to their positive voltage.

The areas and shapes of the photoelectric converting section 23, the second photoelectric converting section 25, and the electron source 26 described above are designed to instantly repeat Mt+1<Mt together with the quantity of accumulated electric charges in Equation 1 presented above. Thus, they are designed to quicken feedback so as to make dt infinitesimally small.

Therefore, the CCD solid-state image pickup device of the present embodiment can reduce shot noise of light utilizing positive holes, which would otherwise be discarded, for the gain control of signal charges.

Embodiment 3

This is an example using an avalanche photodiode (APD) that also functions as a multiplying means in the photoelectric converting section.

Figure 8:
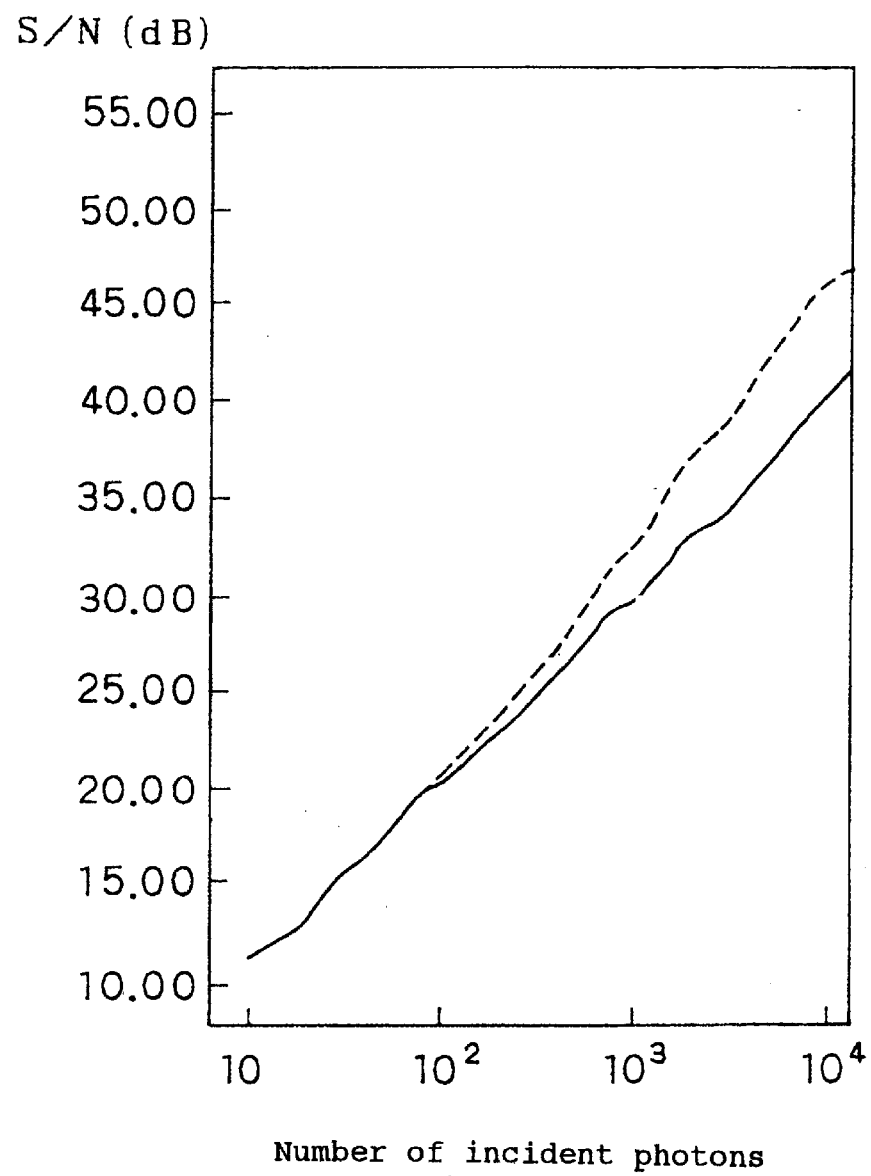
FIG. 8 is a graph showing the number of incident photons versus the S/N ratio according to a simulation of the image pickup device of Embodiment 3 according to the present invention.

Supposing that an Si-avalanche photodiode designed to be compatible with Equation 1 above is incorporated in the CCD solid-state image pickup device as a photoelectric transducer element, and further supposing that excess noise caused by the fluctuation of multiplication gain is small at the time of avalanche multiplication, the result of simulation of the S/N ratio relative to the number of incident photons is shown in FIG. 8. The initial gain is set to be 10.

Furthermore, as an actual multiplication gain is controlled with the voltage applied, it is calculated by substituting the following Equation 3 into Equation 1 presented above.

$$M = \frac{1}{1 + (V/V_B)_{1/3}} + M_{off}$$ [Equation 3]

$M_{off}$: Offset gain $V$: Applied voltage $V_B$: Breakdown voltage

In the figure, the dotted line represents the result of the present embodiment, and the solid line, the result of simulation with a conventional photodiode. It is clearly seen from FIG. 8 that shot noise of light is reduced. However, Equation 3 is not the only expression of relation between multiplication gain M and applied voltage V that can be substituted into Equation 1, but any relation expression can be used if it is compatible with (dM/dV)>0 where M=f (V).

Embodiment 3-2

The simulation of Embodiment 3 is a result obtained where it is supposed that excess noise caused by the fluctuation of multiplication gains is small at the time of avalanche multiplication. In this connection, this excess noise will be explained below, and an example of configuration to reduce it will be shown.

In a conventional Si-APD, since the position where avalanche multiplication takes place cannot be specified, statistical fluctuations occur in multiplication gains. It is because impact ionization energy required for avalanche multiplication is (3/2 Eg+α), and this αis uncertain according to statistical probability. Thus, new noise resulting therefrom is called excess noise (it is called excess electron noise when signal charges are electrons), and is considered partly accountable for S/N ratio deterioration.

However, an avalanche multiplication layer film having one band offset structure can always satisfy the condition:

(3/2 Eg+α)<(1/2 mv²+αE)

where m is the mass of electrons, and the velocity of electrons is v, by enlarging the band offset value ΔE. Thus, by allowing for a large enough band offset not to be affected by the value α, it is possible to generate impact ionization only in the band offset part so that the above-mentioned excess noise can be made infinitesimally small.

Figure 9:
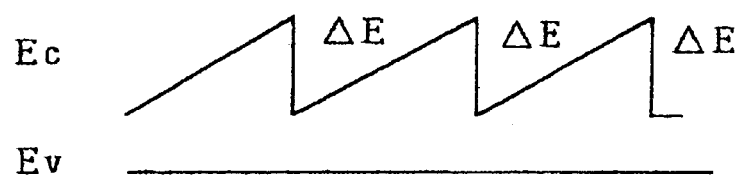
FIG. 9 is a diagram depicting a band state at a zero bias in a band offset type avalanche multiplication layer film.
Figure 10:
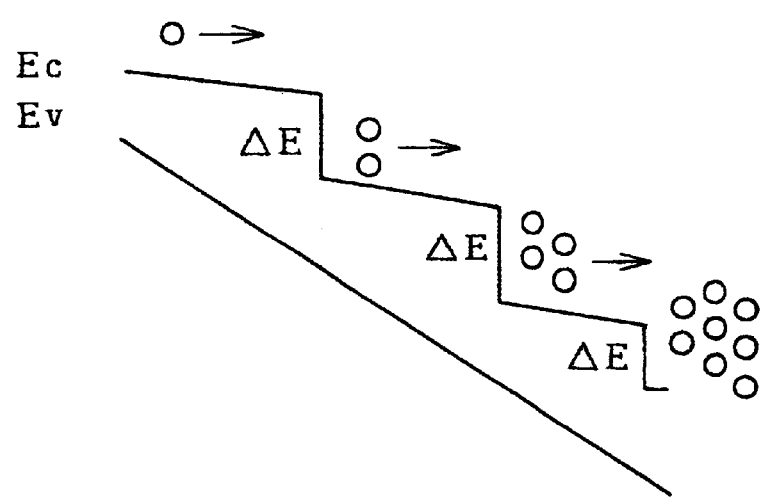
FIG. 10 is a diagram depicting a band state at a reverse bias in a band offset-type avalanche multiplication layer film.
Figure 11:
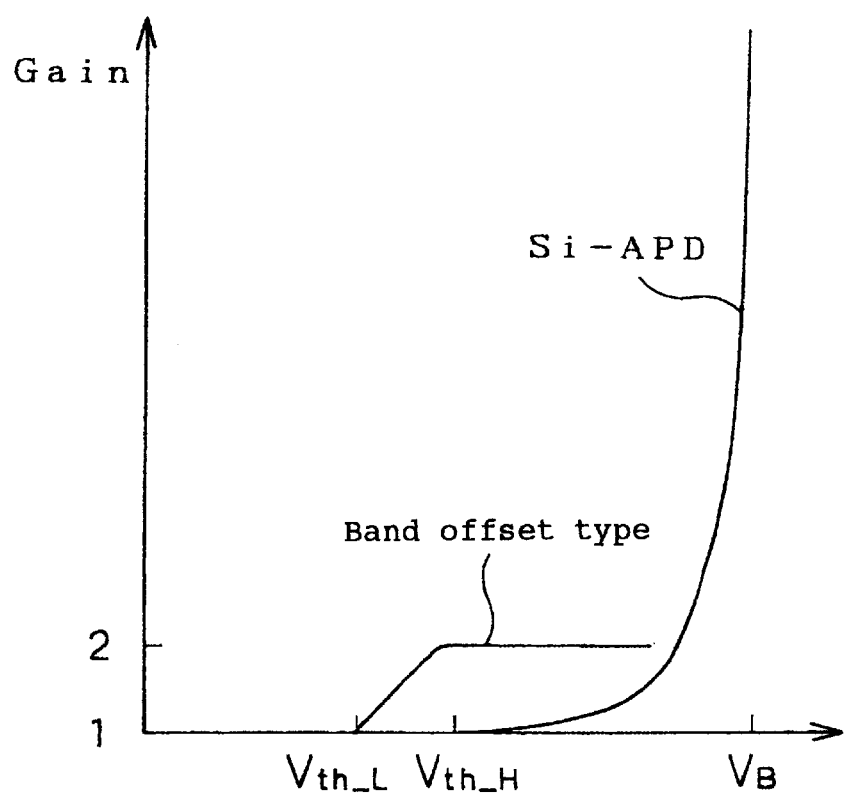
FIG. 11 is a graph illustrating gain characteristics of the band offset type avalanche multiplication layer film and an ordinary Si-avalanche multiplication layer film in relation to applied voltages.

A structure wherein band offset type avalanche multiplication layer films are stacked takes on the state shown in FIG. 9 when the applied voltage is zero. Here, the band offset ΔE is determined by compositional ratio among materials. Only after all the layers are completely depleted, a band state that has the inclination shown in FIG. 10 can be attained, so that the impact ionization can be generated in the position of band offset. The difference in gain characteristics between such band offset type avalanche multiplication layer film and the ordinary silicon avalanche multiplication layer film (Si-APD) is shown in FIG. 11. As shown in FIG. 11, in the ordinary Si-APD, the gain steeply rises in the vicinity of the breakdown voltage $V_B$, but in the band offset type, the gain is 2 when the applied voltage is $V_{th\_H}$ or above, and the gain falls to 1 when the voltage is $V_{th\_L}$ or below. In FIG. 10, the number of stacked avalanche multiplication layers is 3, a $2^3$-fold gain is achieved. However, in such a simple stacked structure, the gain abruptly changes from 1 to 8 according to the applied voltage. Therefore, when used in the electric charge accumulating mode, the gain does not drop gradually with the accumulation of electric charges in such a sequence as 8→4→2→1, so that the effect to suppress shot noise of light, which is the purpose of the present embodiment, cannot be expected.

Thus, in this embodiment, a structure that suppresses the gain together with the accumulated quantity of electric charges is adopted as well as the band offset type avalanche multiplication layer film, with a view to reducing both excess noise and shot noise of light.

Figure 12:
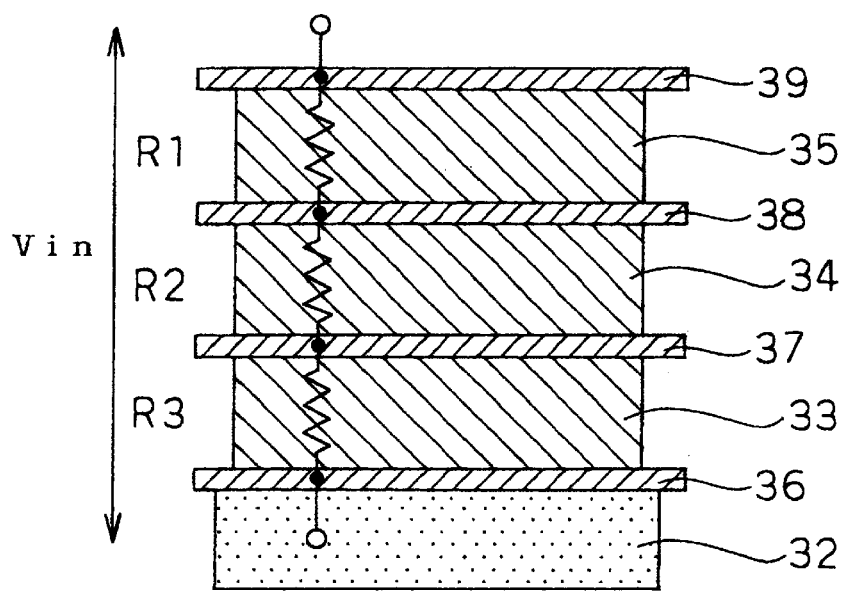
FIG. 12 is a sectional view showing a photoelectric transducer of Embodiment 3-2 according to the present invention.

FIG. 12 is a sectional view in the direction of film thickness showing a photoelectric transducer of this example. A photoelectric transducer 31 has three band offset type avalanche multiplication layer films 33, 34, and 35 stacked over an electric charge accumulating section 32, wherein conducting films 36, 37, 38, and 39 are disposed between the layers, and has a structure in which each space between the films is connected to fixed resistances $R_1$, $R_2$ and $R_3$. The electric charge accumulating section 32 is composed of an ordinary silicon photodiode (Si-PD) 32. The films 36 to 39 are composed of, for example, indium (In), polysilicon or the like. Fixed resistances $R_1$ to $R_3$ are composed of, for instance, polysilicon or the like. However, the series of resistances are made of materials having the same sheet-resistance value, and are precisely controlled so that each have a prescribed value that satisfies the requirement for the resistance ratio among the three to be $R_1<R_2<R_3$ by varying junction areas.

Figure 13:
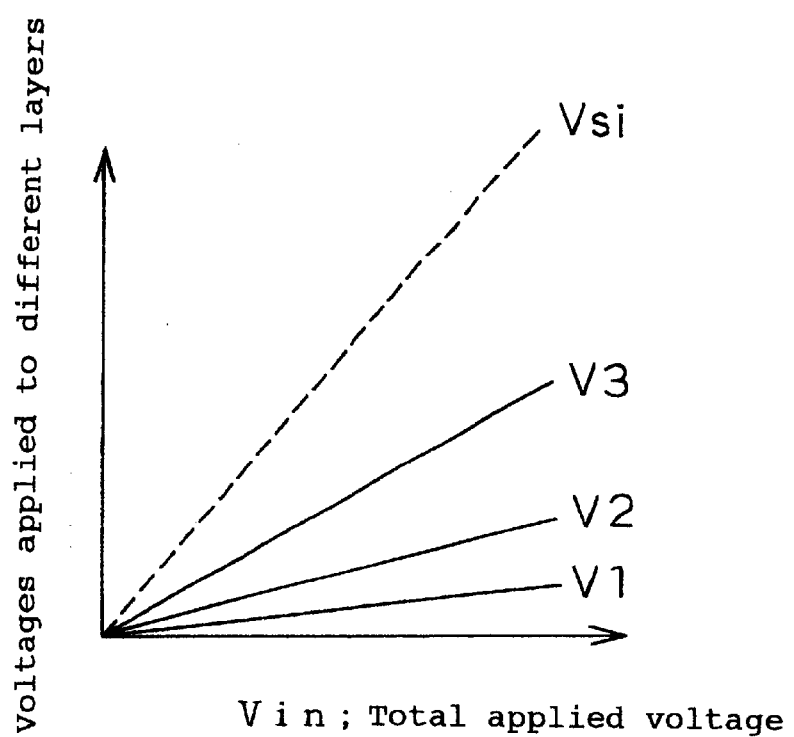
FIG. 13 is a graph depicting the relationship between applied voltages applied to the photoelectric transducer of Embodiment 3-2 according to the present invention and applied voltages applied to different layers.
Figure 14:
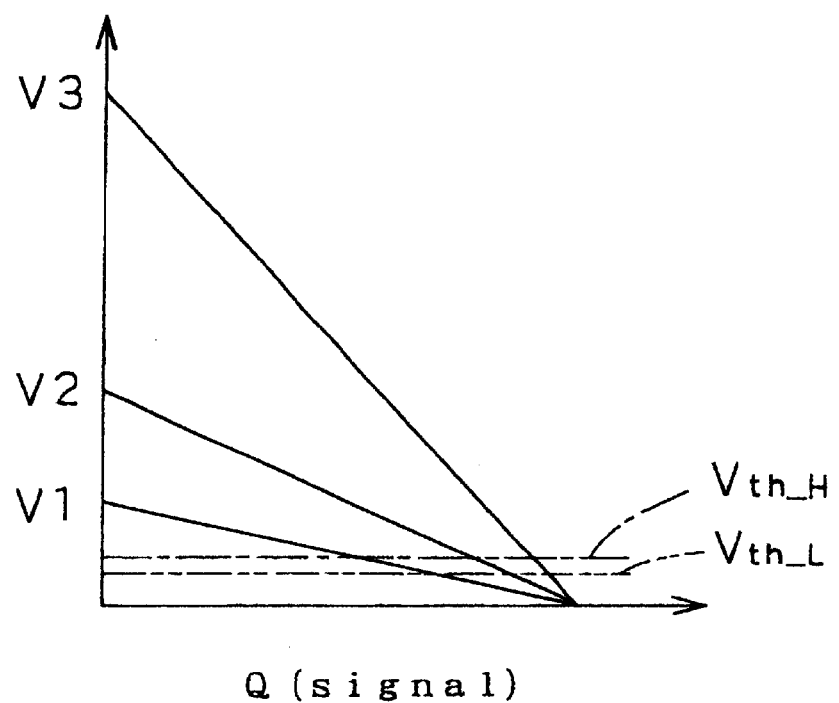
FIG. 14 is a graph showing the relationship between the voltages applied to different layers in the photoelectric transducer of Embodiment 3-2 according to the present invention and the quantity of accumulated electric charges.
Figure 15:
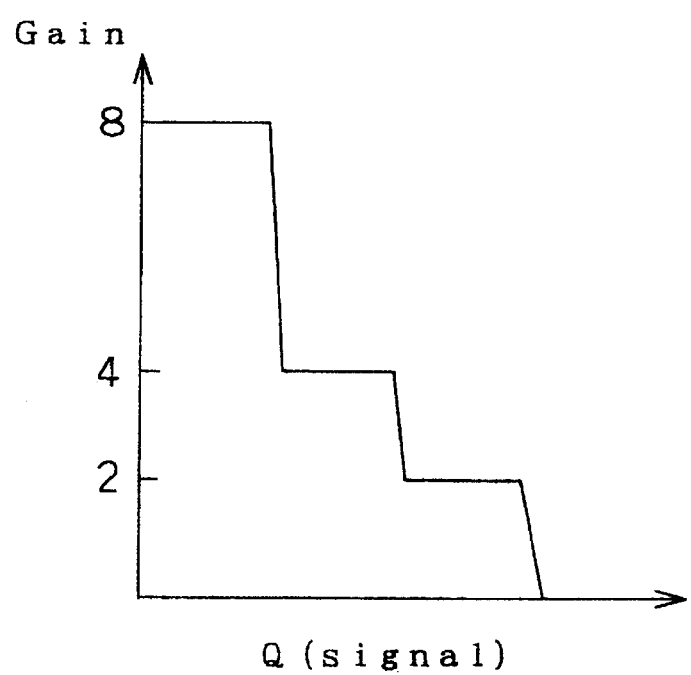
FIG. 15 is a graph illustrating the relationship between the number of accumulated electric charges and gains in the photoelectric transducer of Embodiment 3-2 according to the present invention.
Figure 16:
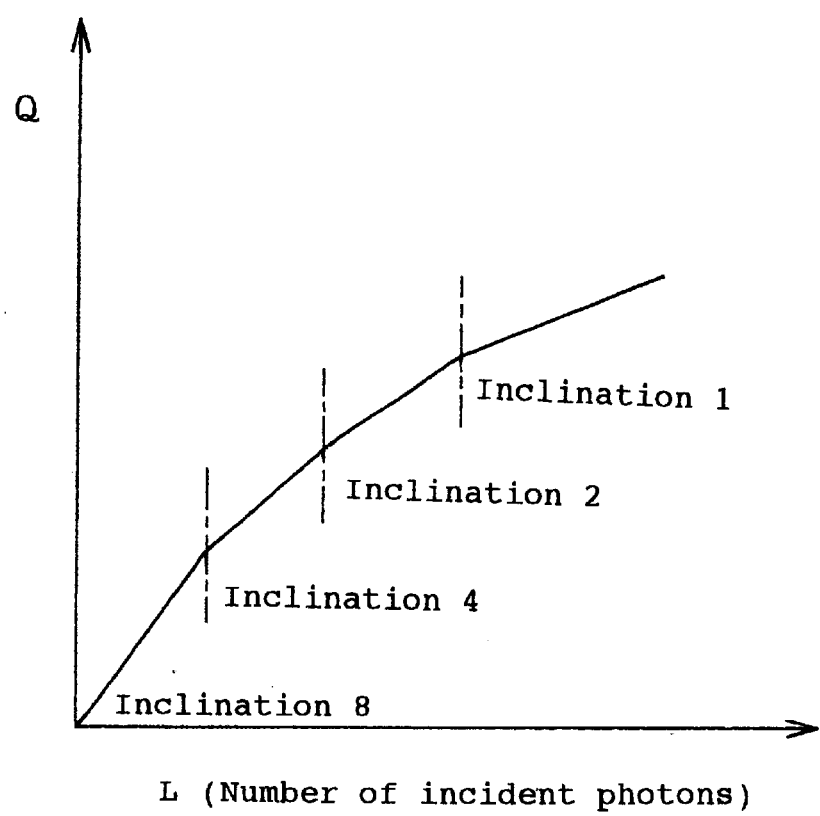
FIG. 16 is a graph showing relationships between the number of incident photons and the number of storage electric charge in the photoelectric transducer of Embodiment 3-2 according to the present invention.

In this structure, the following voltages are applied to the respective layers:

$V_{in}=V_0=(-Q/C)$ $V_1=\{R_1/(R_1+R_2+R_3)\}\cdot V_{in}$ $V_2=\{R_2/(R_1+R_2+R_3)\}\cdot V_{in}$ $V_3=\{R_3/(R_1+R_2+R_3)\}\cdot V_{in}$ where $V_0$ is the initially applied voltage; $V_{in}$, the total applied voltage; Q, the quantity of accumulated signal charges; and C, the capacity of accumulation. The relationships between the total applied voltage $V_{in}$ and the voltages applied to individual layers are as shown in FIG. 13. The inclination of each straight line corresponds to the ratio among $R_1$, $R_2$ and $R_3$. In FIG. 13, $V_{in}$ becomes smaller with an increase of Q due to the relationship of $V_{in}$, $V_{in}=(-Q/C)$. The voltages $V_1$ to $V_3$ applied to the different layers become smaller accordingly. Therefore, the. relationship between $V_1$ to $V_3$ and Q is as shown in FIG. 14. In each layer, as already mentioned, the gain is 2 when the applied voltage is $V_{th\_H}$ or above, and the gain becomes 1 when it is $V_{th\_L}$ or below. Thus, when this stacked film structure is used in the electric charge accumulating mode, gain characteristics to gradually suppress the gain with an increase in the quantity of accumulated electric charges as shown in FIG. 15. Accordingly, where the primary photoelectric conversion efficiency is set constant, the input/output characteristics shown in FIG. 16 are achieved with respect to the amount of incident light.

Figure 17:
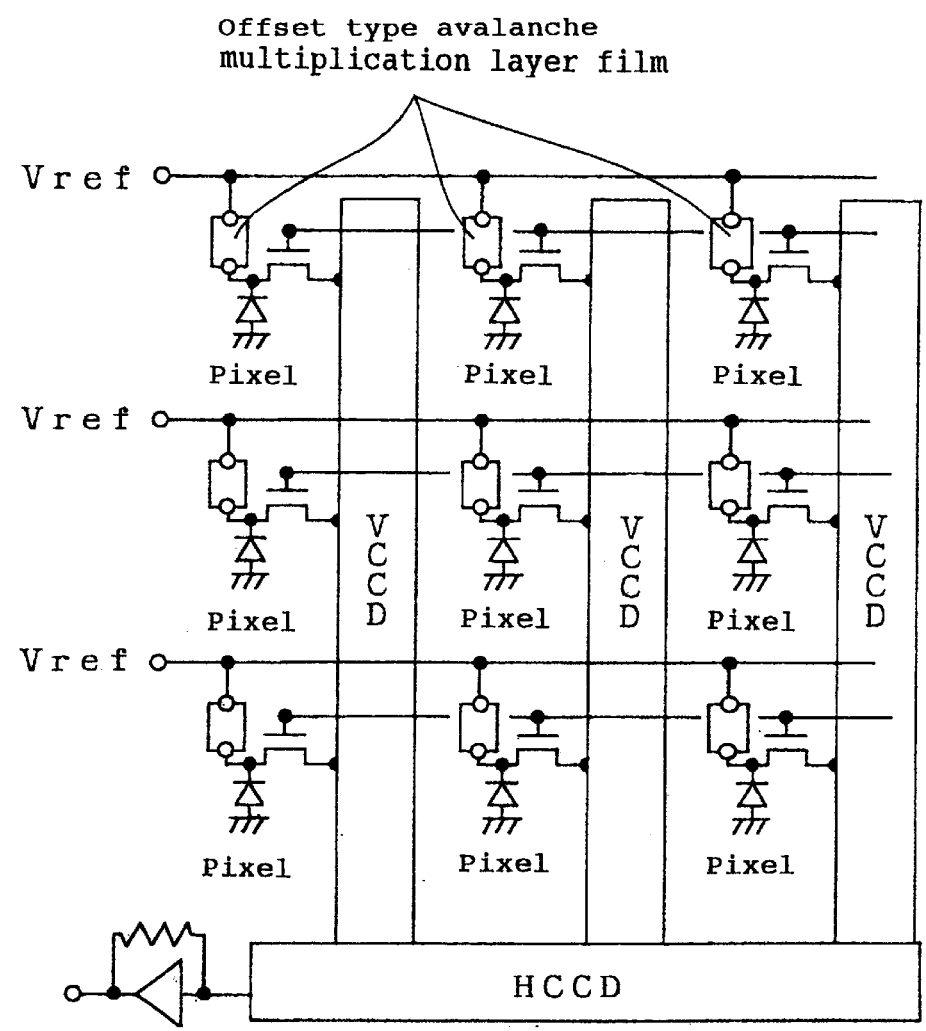
FIG. 17 is a diagram depicting a configuration applying the photoelectric transducer of Embodiment 3-2 according to the present invention to a two-dimensional CCD image pickup device.
Figure 18:
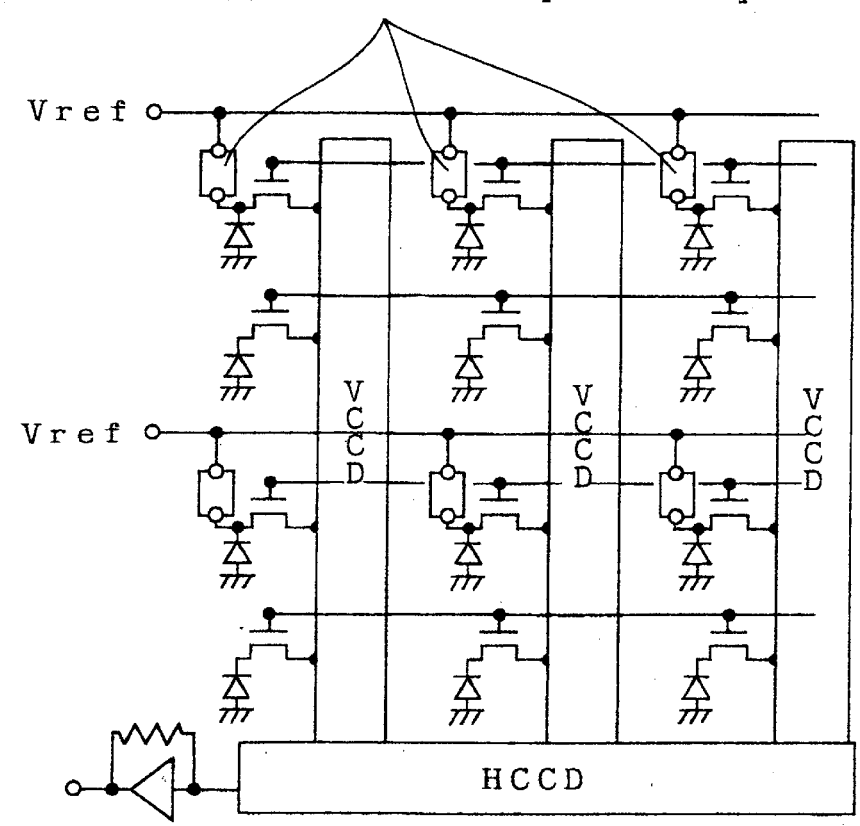
FIG. 18 is a diagram showing a configuration of combined use of the photoelectric transducer of Embodiment 3-2 according to the present invention with a conventional photoelectric transducer in a two-dimensional CCD image pickup device.

FIG. 17 is a diagram depicting a configuration in which a photoelectric transducer 31 of this example is assigned for each pixel in a two-dimensional CCD image pickup device. In the figure, each $V_{ref}$ is a common electrode for applying a fixed voltage; each VCCD, a vertical transfer area, and HCCD, a horizontal transfer area. FIG. 18 is a diagram showing a configuration, wherein pixels each having an ordinary photodiode and pixels each having a photoelectric transducer of this example are alternately arranged in the vertical transfer direction.

Embodiment 3-3

Figure 19:
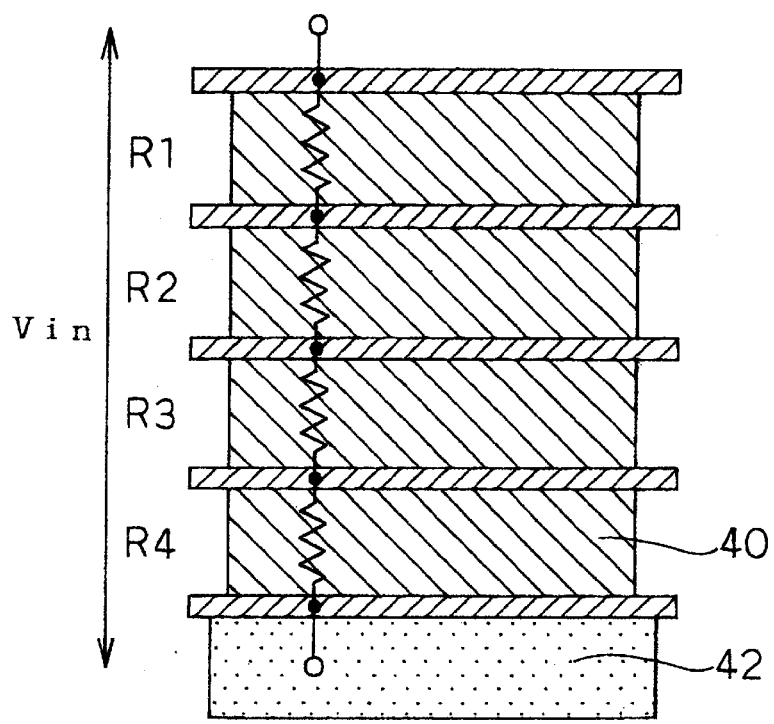
FIG. 19 is a sectional view illustrating a photoelectric transducer of Embodiment 3-3 according to the present invention.
Figure 20:
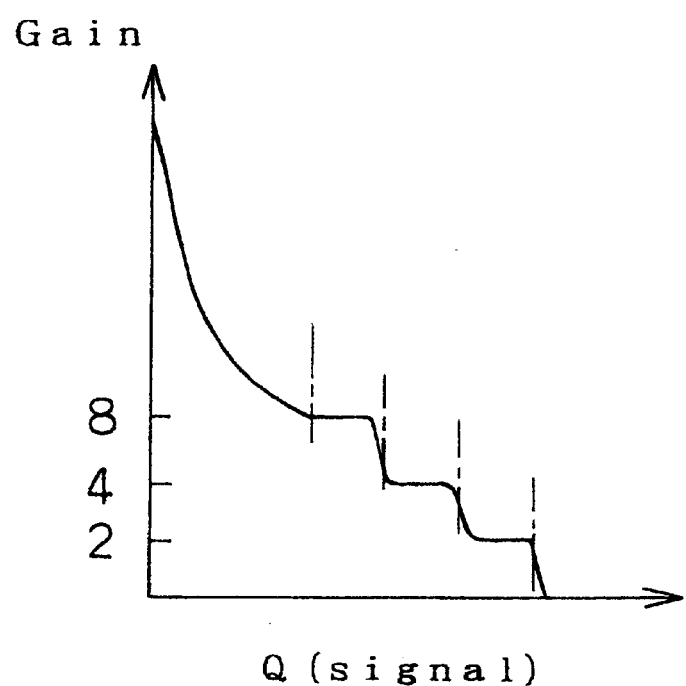
FIG. 20 is a graph showing the relationship between the number of accumulated electric charges and gains in the photoelectric transducer of Embodiment 3-3 according to the present invention.
Figure 21:
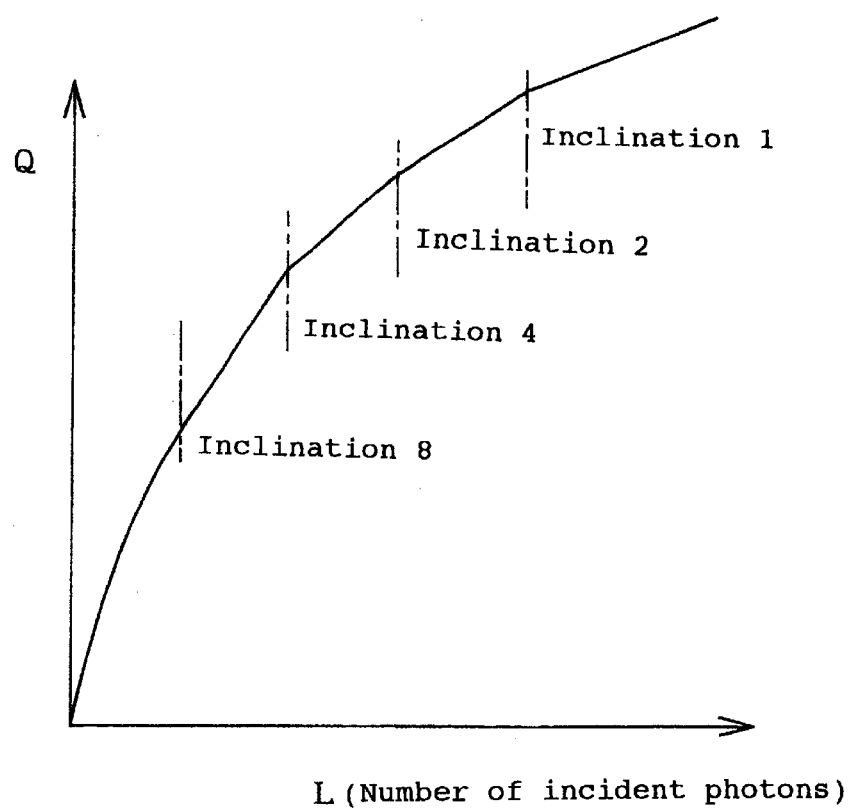
FIG. 21 is a graph depicting the relationship between the number of incident photons and the number of accumulated electric charges in the photoelectric transducer of Embodiment 3-3 according to the present invention.

In Embodiment 3-2, as shown in FIG. 15, the initial gain suddenly rises to eight. Thus, as shown in FIG. 19, it is recommendable to dispose an ordinary Si-APD film 40 in the position closest to an electric charge accumulating section 42. This enables, though an S/N ratio deterioration is caused by excess noise, consecutive initial gains to be obtained. According to the McIntyre excess electron noise formula, for Si-APD, $$S/N = M2\{kM+(1-k)(2-1/M)\}$$

holds where M is the gain, $\alpha$ and $\beta$ are the impact ionization rates per unit distance for electrons and positive holes, respectively, and $\alpha/\beta=k$; the larger the gain, the more the S/N ratio deteriorates. Accordingly, combined use of an Si-APD with a band offset type serves to reduce excess electron noise compared with the use of an Si-APD alone, and a comparable gain can be achieved. In this case, the input/output characteristics in relation to the amount of incident light are as shown in FIG. 21.

Embodiment 3-4

With the two embodiments described above, it is possible to change multiplication gains by an exponentiation of 2. However, when used in the electric charge accumulating mode, if the initial gain is enlarged by increasing the number of stacked layers, changes in gain with the amount of incident light will be abrupt and discontinuous, so that fine gain control is made impossible. If the number of stacked layers is 10, for example, the multiplication gain will suddenly and discontinuously drop from $2^{10}$ (=1024) to $2^9$ (=512).

Figure 22:
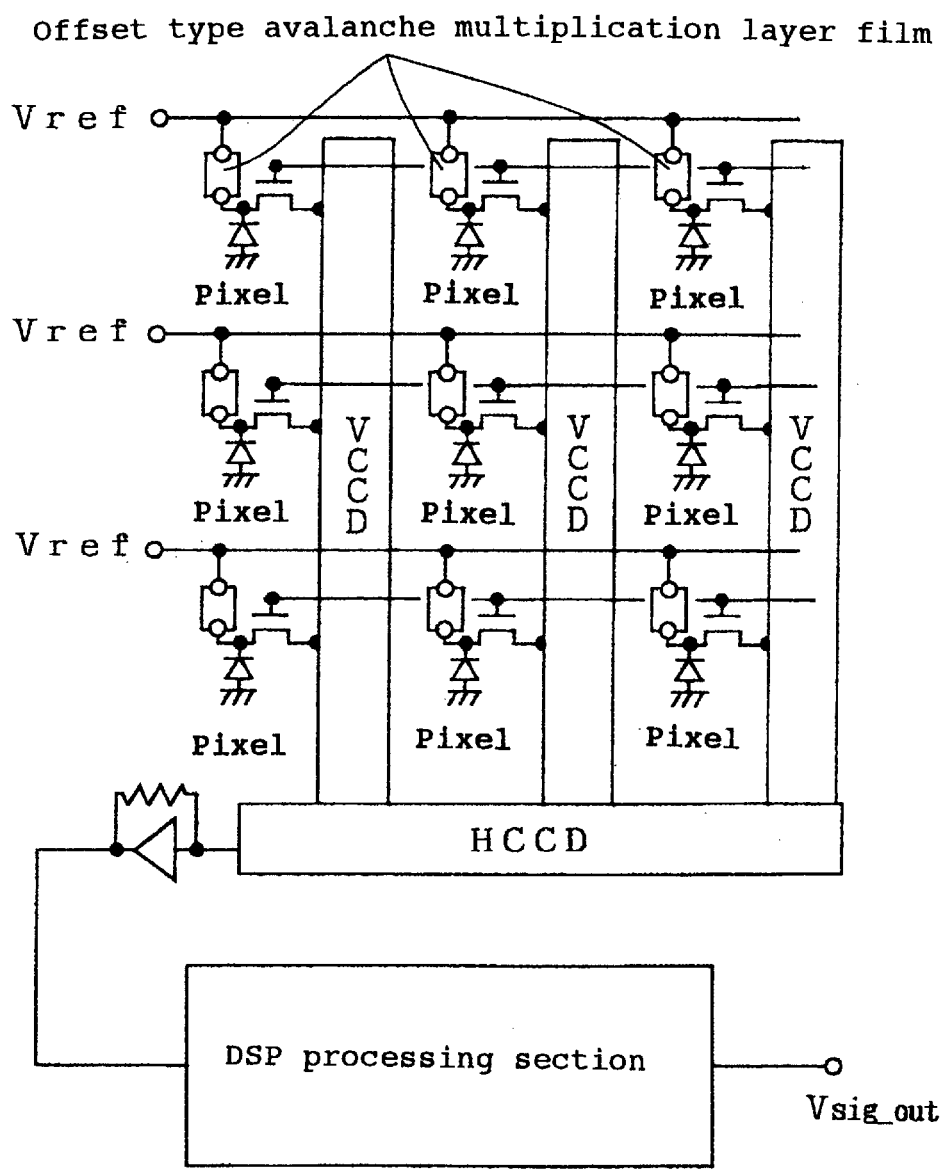
FIG. 22 is a diagram showing a configuration combining the two-dimensional CCD image pickup device incorporating the photoelectric transducer of Embodiment 3-2 according to the present invention and the DSP of Embodiment 1.
Figure 23:
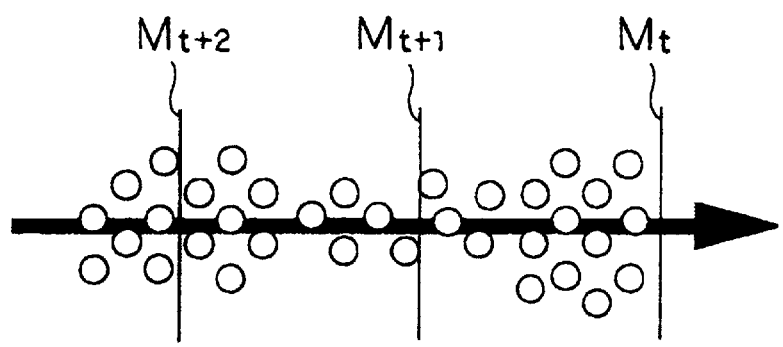
FIG. 23 is a diagram for describing the principle of the present invention.
Figure 24:
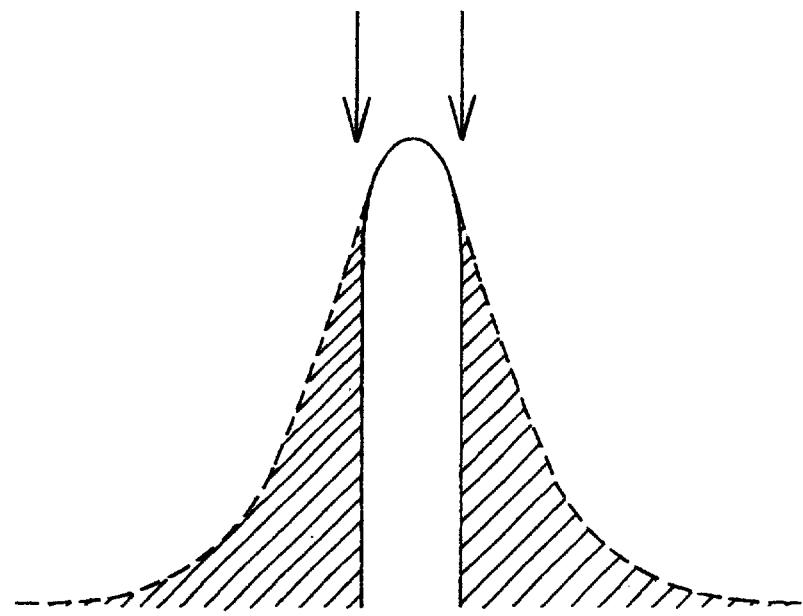
FIG. 24 is another diagram for describing the principle of the present invention.

Thus, as shown in FIG. 22, smooth control of the gain from 1024, 1023, to 1022 is made possible by connecting and using in combination the DSP disclosed in Embodiment 1.

Incidentally, although all the foregoing embodiments have been described with an assumption of their use with a CCD type image sensor, it is obvious that the present invention can also be effective if used with an image pickup tube or a MOS type image sensor, or any image pickup devices that may emerge in the future, or devices that pick up the all kinds of electromagnetic waves as stated above.

Industrial Applicability

As described above, according to the present invention, shot noise of light is reduced, so that high quality images can be obtained even if the time of exposure to light is short.

More specifically, clear images can be picked up with high resolution even where it is very dark such as on a new moon's night.

What is claimed is:

1. A photoelectric transducer comprising:
   a first photoelectric converting section for generating an electric charge according to incident light,
   an accumulating section for accumulating electric charges generated by said first photoelectric converting section,
   an amplifying section for amplifying the electric charge outputted from said accumulating section with a prescribed gain, and
   a storage section for storing signal charges amplified by the amplifying section during a 1 field/1 frame period,
   wherein;
      the 1 field/1 frame period being separated into a plurality of subperiods, and
      said prescribed gain in the amplifying section varies during the 1 field/1 frame period, the prescribed gain having an initial value during a first subperiod of the 1 field/1 frame period and a value during other subperiods determined on the basis of the number of electric charges stored in said storage section during a preceding portion of the 1 field/1 frame period.

2. The photoelectric transducer, as set forth in claim 1, wherein:
   an A/D converter for converting an analogue signal outputted from said accumulating section into a digital signal is provided, and
   said amplifying section and said accumulating section perform digital processing.

3. The photoelectric transducer, as set forth in claim 1 or 2, wherein the number of electric charges stored is a function of a value resulting from the integration of the product of said prescribed gain and the number of accumulated electric charges per unit time from a beginning of the 1 field/1 frame period to a current time.

4. A photoelectric transducer comprising:
   a first photoelectric converting section, disposed in a light receiving section, for generating an electric charge according to incident light,
   an accumulating section for accumulating signal electric charges from said first photoelectric converting section, and
   a negative feedback amplifying section,
   wherein;
      said negative feedback amplifying section is of a conducting type reverse to said first photoelectric converting section, disposed adjoining said first photoelectric converting section in the light receiving section, and includes;
         a second photoelectric converting section for generating an electric charge according to incident light, and
         a charge source of the same conducting type as said photoelectric converting section for supplying electric charges to said accumulating section, and
      signal charges flowing from said charge source is caused to be modulated, in 1 field/1 frame period, by the signal charges generated or accumulated by said second photoelectric converting section.

5. The photoelectric transducer, as set forth in claim 4, wherein said modulation is such that:
   when the signal charges accumulated in said accumulating section are greater, the signal charge supply from said charge source to said accumulating section is reduced, and
   when the signal charges accumulated in said accumulating section are smaller, the signal charge supply from said charge source to said accumulating section is increased.

6. The photoelectric transducer, as set forth in one of claims 1 to 2, wherein said first photoelectric converting section and said accumulating section constitute the photoelectric transducer.

7. A solid-state image pickup element comprising:
   the photoelectric transducer, as set forth in one of claims 4 to 5, and a transfer area for transferring said signal charge photoelectrically accumulated.

8. A photoelectric transducer comprising:

a photoelectric converting section for generating an electric charge according to incident light, an accumulating section for accumulating electric charges generated by said photoelectric converting section, and an A/D converter for digitizing a set of the signal charges accumulated in said accumulating section at each breakdown or non-breakdown readout, an amplifying section for amplifying the electric charge outputted from said accumulating section with a prescribed gain, and a storage section for storing a signal charge amplified by the amplifying section during a 1 field/1 frame period, wherein;

regarding each set of signal charges consecutively outputted from the A/D converter, the sets of signal charges having the largest value and the smallest value, or a plurality of the sets of signal charges are abandoned within a predetermined number of consecutive sets of signal charges, the 1 field/1 frame period being separated into a plurality of subperiods, and said prescribed gain in said amplifying section varies during the 1 field/1 frame period, the prescribed gain having an initial value during a first subperiod of the 1 field/1 frame period and a value during other subperiods determined on the basis of the number of electric charges stored in said storage section during a preceding portion of the 1 field/1 frame period.

9. The photoelectric transducer, as set forth in claim 8, wherein said predetermined number of consecutive sets of signal charges are successively selected with no overlap with any of the previous consecutive sets of signal charges.

10. A photoelectric transducer comprising:

a photoelectric converting section for generating an electric charge according to incident light, an accumulating section for accumulating electric charges generated by said photoelectric converting section, and an A/D converter for digitizing a set of the signal charges accumulated in said accumulating section at each breakdown or non-breakdown readout, wherein regarding each set of signal charges consecutively outputted from the A/D converter, the sets of signal charges having the largest value and the smallest value, or a plurality of the sets of signal charges are abandoned within a predetermined number of consecutive sets of signal charges successively selected with partial overlap with a previous predetermined number of consecutive sets of signal charges.

11. A photoelectric transducer comprising:

the photoelectric transducer, as set forth in claim 10, an amplifying section for amplifying the electric charge outputted from said accumulating section with a prescribed gain, and a storage section for storing a signal charge amplified by the amplifying section during a 1 field/1 frame period, wherein;

the 1 field/1 frame period being separated into a plurality of subperiods, and said prescribed gain in said amplifying section varies during the 1 field/1 frame period, the prescribed gain having an initial value during a first subperiod of the 1 field/1 frame period and a value during other subperiods determined on the basis of the number of electric charges stored in said storage section during a preceding portion of the 1 field/1 frame period.

* * * * *